United States Patent
Matsutomo

[11] Patent Number: 6,037,652
[45] Date of Patent: *Mar. 14, 2000

[54] LEAD FRAME WITH EACH LEAD HAVING A PEEL GENERATION PREVENTING MEANS AND A SEMICONDUCTOR DEVICE USING SAME

[75] Inventor: Mitsuhiro Matsutomo, Kumamoto, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/865,450

[22] Filed: May 29, 1997

[51] Int. Cl.⁷ .......................... H01L 23/28; H01L 23/50; H01L 23/495
[52] U.S. Cl. .......................... 257/666; 257/676; 257/782; 257/787; 257/671; 361/813; 174/52.2; 252/672; 252/692
[58] Field of Search .................. 257/676, 665, 257/782, 668, 692, 672, 686, 784, 786, 787, 671; 174/52.2; 361/813

[56] References Cited

U.S. PATENT DOCUMENTS

| | | | |
|---|---|---|---|
| 5,276,351 | 1/1994 | Yamuzuki et al. | 257/666 |
| 5,424,578 | 6/1995 | Fujita et al. | 257/666 |
| 5,540,318 | 7/1996 | Mahulikor et al. | 257/666 |
| 5,554,886 | 9/1996 | Song | 257/666 |
| 5,710,457 | 1/1998 | Uno | 257/666 |

FOREIGN PATENT DOCUMENTS

| | | | |
|---|---|---|---|
| 57-69769 | 4/1982 | Japan | 257/787 |
| 2-60150 | 2/1990 | Japan | 257/787 |
| 246754 | 2/1990 | Japan . | |
| 2106061 | 4/1990 | Japan . | |
| 2-125454 | 5/1990 | Japan | 257/787 |
| 3236271 | 10/1991 | Japan . | |
| 4-15942 | 1/1992 | Japan | 257/787 |
| 4-158557 | 6/1992 | Japan | 257/787 |
| 4-213864 | 8/1992 | Japan | 257/666 |
| 4-214643 | 8/1992 | Japan | 257/784 |

*Primary Examiner*—Alexander Oscar Williams
*Attorney, Agent, or Firm*—Ostrolenk, Faber, Gerb & Soffen, LLP

[57] ABSTRACT

A lead frame is provided that prevents breaks in bonding wires caused by thermal stress which is applied when mounting a resin semiconductor. A plating layer is applied to the surfaces of internal leads to which bonding wires are to be connected and an insulating tape is adhered the internal lead 1 tips and bonding balls, so as to prevent peeling between the internal leads 1 and the resin, thereby preventing breaking of a bonding wire cause by stress applied during mounting. Additionally, a semiconductor device which makes use of this lead frame structure is provided.

12 Claims, 6 Drawing Sheets

30
1 - LEAD
2 - PLATING LAYER
3 - INSULATING TAPE
4 - ISLAND

5 - ADHESIVE

8 - BONDING WIRE
6 - SEMICONDUCTOR CHIP
7 - RESIN

LEAD FRAME WITH EACH LEAD HAVING A PEEL GENERATION PREVENTING MEANS AND A SEMICONDUCTOR DEVICE USING SAME

BACKGROUND OF THE INVENTION

1. Field of the Invention

The present invention relates to a lead frame and also to a resin-sealed semiconductor device which uses that lead frame.

2. Description of Related Art

FIGS. 6(A), (B), (C) and (D) are, respectively, a plan view of an example of a lead frame of the past, an expanded plan view of an internal lead part thereof, a cross-sectional view of a resin sealed semiconductor devices which uses this lead, and a partial enlarged cross-sectional view about a connecting portion formed between a bonding wire and a lead.

In the past, a lead frame, as shown in FIGS. 6(A) and (B), was formed by a plating the tip of lead 1, which is made from a 42% Ni-Fe alloy or copper, to form a plating layer 2 as a bonding area. This plating layer 2 is formed on the tip of the lead 1 to provide an undercoat that assures electrical conductivity and joining of the wiring bond. Silver plating is usually used as the material for plating layer 2.

Turning to FIG. 6(C), a semiconductor chip is mounted onto a lead frame island 4, the boding wires 8 are made of gold, are connected to terminals formed on the chip, and the bonded portion are sealed with an epoxy resin 7. The connection surfaces formed between the bonding wires 8 and the tip portion of the leads 1, as shown in FIG. 6(D), is a flat configuration formed only by the plating layer 2.

The bonding ball portion which is an end portion of the bonding wire and to be connected to the lead is connected thereto in a crushed shape, the crushed part leaving a shape that is thinner than the wire part.

FIGS. 7(A), (B), and (C) are, respectively, a cross-sectional view of a resin-sealed semiconductor device, which illustrates problems in the prior art lead frame, and cross-sectional views which illustrate the mechanism whereby peeling occurs at a part a thereof.

As shown in FIGS. 7(A), (b), and (C), in a prior art resin-sealed semiconductor device, when the semiconductor is mounted by the user, if the package, has absorbed moisture, by virtue of thermal expansion of moisture within the package, caused by thermal stress, expansion of moisture content occurs at the boundary between the resin 7 and the plating layer 2. This situation leads to the problem of peeling generated at a phase formed between the surface of plating layer 2 and the surface of the sealing resin, from the tip of the lead 1, along the plating layer 2.

The first problem that arises with resin-sealing semiconductor devices in the past is that of broken bonding wires leading to an open connection failure, which occurs because of expansion of water content within the package caused by thermal stress. This happens if the package absorbs water at the time the user mounts the device.

The reason for this is that expansion of the moisture content absorbed therein when it is mounted, usually occurs at the lead tip within the package.

The lead tip plated area is a silver plated area, which oxidizes during the manufacturing processes before resin sealing of the lead frame.

As a result, there is a deterioration of the intimate contact at the boundary between the resin and the plated area, this leading to generate the peeling on the boundary between the resin and the plating layer caused by moisture content expansion, the moisture of which was absorbed when the device is mounted.

This peeling progresses from the lead tip along the plating layer in any direction, as shown by line P in FIG. 7(C), causing an open connection in the bonding wire at the crushed part of the bonding ball, at which the wire is thin.

In view of the above-noted problem with the prior art, an object of the present invention is to provide a highly reliable resin-sealed semiconductor device with improved user mounting characteristics.

SUMMARY OF THE INVENTION

To achieve the above-noted object of the present invention, a lead frame according to the present invention basically has the following technical conception in that the lead frame comprising a plurality of leads and wherein each one of leads being provided with a peel generation preventing means on a surface of a portion of a lead which is formed between a tip portion of the lead and a portion thereof to which a bonding wire is connected.

In the present invention, as shown in FIGS. 1 and 2, by providing a peeling generation preventing means 3 which acts as a stopper, on a portion of a surface or the tip portion of the lead, formed between the tip of lead 1 and the bonding portion of the bonding wire, i.e., the bonding ball, the peeling which occurs from the tip of the lead 1, stops at the position of the peeling generation preventing means 3, so that it does not reach the portion on which the bonding wire 8, is bonded.

As shown in FIG. 5, by coating the bonding ball with dripped resin, the peeling generated from the tip of the lead 1 processes along the top side of the dripped resin 9 and plating layer 2. By coating the dripped resin 9, the thin part of the bonding bail is protected, so that the strength of peeling part of the bonding wire 8 is great enough that the bonding wire is not broken.

DETAILED DESCRIPTION OF THE PREFERRED EMBODIMENTS

Figure 1A:
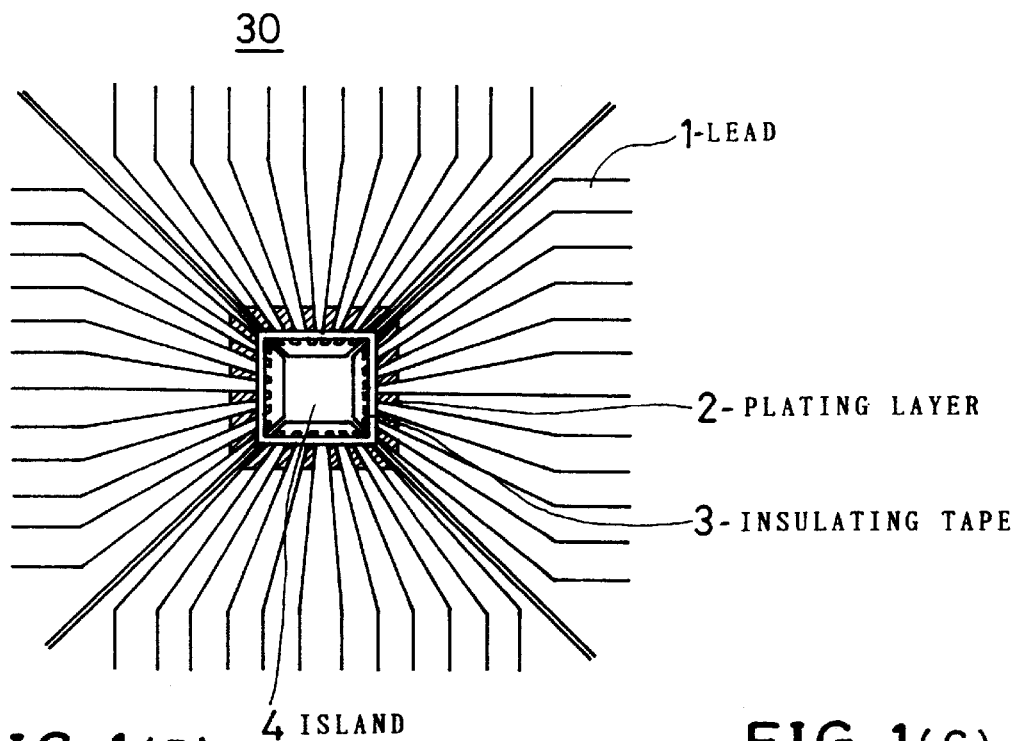
FIG. 1(A) through FIG. 1(E) are a plan view, a partial enlarged plan view, a cross-sectional view thereof, and cross-sectional view and a partial enlarged cross-sectional view of the first embodiment of the present invention.

Embodiment of the present invention are described below, with reference being made to the relevant accompanying drawings.

FIG. 1(A) through FIG. 1(E) show one embodiment of the lead frame of the present invention in which a lead frame 30 comprising a plurality of leads 1 and wherein each one of leads 1 is provided with a peel generation preventing means 3 on a surface of each lead 1 between a tip portion 21 of the lead 1 and a portion 20 of the surface. Of the lead 1 to which a bonding wire 8 is connected.

In the present invention, the peel generation preventing means 3 is formed so as to be projected from the surface 20 or the lead portion 1 and be apart from the bonding wire 8.

Further, in the present invention, the peel generation preventing means 3 may be made of a resin material.

The embodiment of the present invention will be explained more precisely hereunder.

Figure 1B:
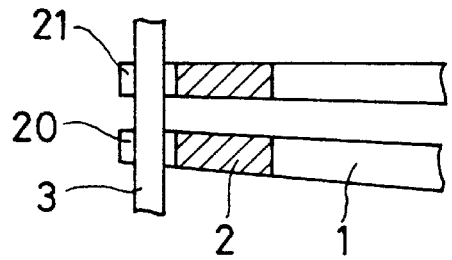
Figure 1C:
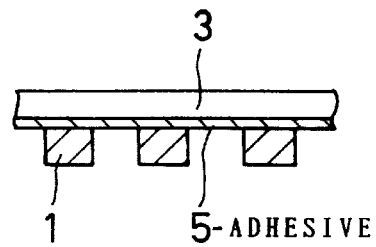
Figure 1D:
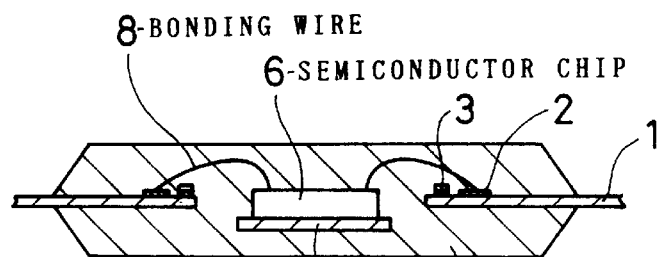
Figure 1E:
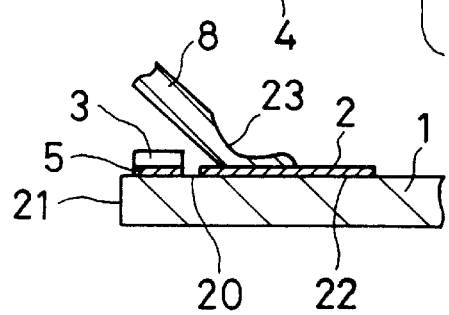
Figure 2:
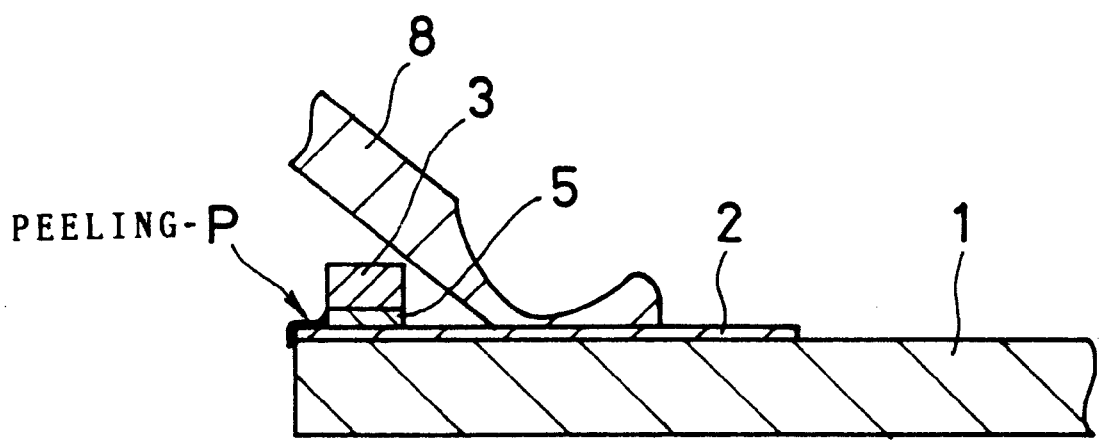
FIG. 2 is a cross-sectional view which illustrates the effect of the first embodiment of the present invention.

FIG. 1(A) through FIG. 1(E) are a plan view, a partial enlarged plan view, a cross-sectional view thereof, and cross-sectional view and a partial enlarged cross-sectional view of the first embodiment of the present invention, and FIG. 2 is a cross-sectional view which illustrates the effect of the first embodiment of the present invention.

As shown in FIG. 1(A) through FIG. 1(c), in a lead frame according to the first embodiment of the present invention, the peeling generation preventing means 3, for example, an insulating tape 3 of polyamide, is adhered to the tip surface 20 of the tip portion 21 of the lead 1 with an intervening adhesive 5 of film resin having a thickness of approximately 10 μm.

This insulating tape 3, serving as the peeling generation preventing means as defined by the present invention, is adhered so as to make connections between adjacently arranged loads 1 and to stably fix them to each other. To a bonding area 22, formed on a surface of the lead 1 and opposite side of the tip end portion 21 of the lead 1. With respect to the peeling generation preventing means 3, such as the insulating film tape 3, a plating layer 2 is applied.

The reason why no plating area 2 in applied to the surface area 20 of the tip end portion 21 of the lead 1 to which the insulating tape 3 is adhered, is to prevent migration from the plating layer 2 in the adhesive 5 and the insulating tape 8.

In a semiconductor device which uses a lead frame 30 according to the first embodiment of the present invention, as shown in FIG. 1(D) and FIG. 1(E), there is a connection between the plating layer 2 of the bonding areas 22 of the lead 1 and the semiconductor chip 6, there being is this arrangement an insulating tape 3 adhered by the adhesive 5 between the tip portion 21 of the lead 1 and the bonding area 22.

For this reason, as shown in FIG. 2, it is possible to prevent the occurrence of a break in the bonding wire 8 by preventing the generation of the peeling in the tip portion 20 of the lead 1, caused by the expansion of moisture content absorbed thereinto when mounting is done by the user, and to prevent it from reaching the bonding portion 23.

FIG. 3(A) through FIG. 3(E) are a plan view of a lead frame of the second embodiment of the present invention, a partial enlarged plan view thereof, a cross-sectional view thereof, and a cross-sectional view and a partial enlarged cross-sectional thereof.

In a lead frame according to the second embodiment of the present invention, as shown in FIG. 3(A) through FIG. 3(E), the peeling generation preventing means 3, for example, an insulation tape made of polyimide, is adhered to the surface area 20 of a tip portion 21 of the lead 1 in such a manner as to keep the leads 1 separate, using an intervening adhesive 5 of film resin having a thickness of approximately 10 μm.

By forming the lead frame in the above noted manner, because the peeling generation preventing means 3 does not exist between the leads 1, it is possible to prevent the dissolving out of impurities into the adhesive 5 and the occurrence of migration from the plating layer, thereby preventing short circuit failures between leads 1.

Therefore, the problem is eliminated, regardless of whether or not there exists a plating layer 2 in the area in which the insulating resin material serving as the peeling generation preventing means is adhered to the lead 1 by the adhesive 5.

Another feature of this arrangement is that it is not necessary to have the peel generation preventing means 3 of an insulating material.

In this case, the construction of this lead frame can be made by adhering the insulating tape 3 after the formation of the plating layer 2, and then by pressing the lead 1 simultaneously with the insulating tape 3.

Figure 3A:
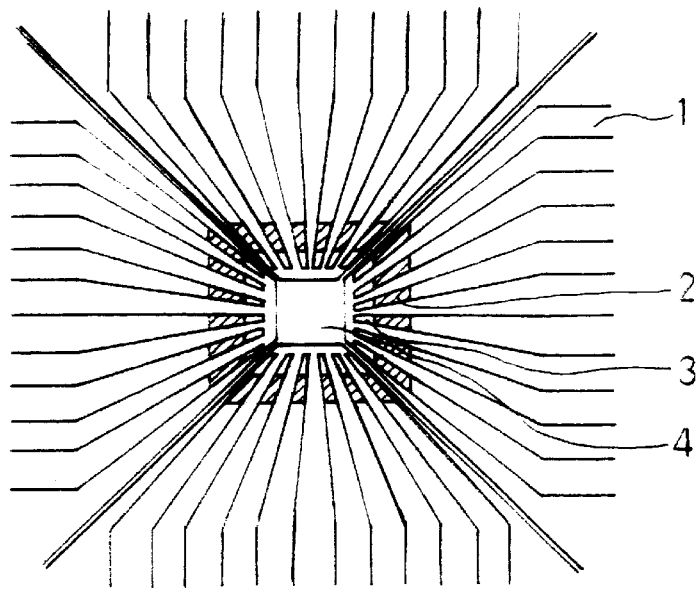
FIG. 3(A) through FIG. 3(E) are a plan view of a lead frame of the second embodiment of the present invention, a partial enlarged plan view thereof, a cross-sectional view thereof, and a cross-sectional view and a partial enlarged cross-sectional thereof.
Figure 3B:
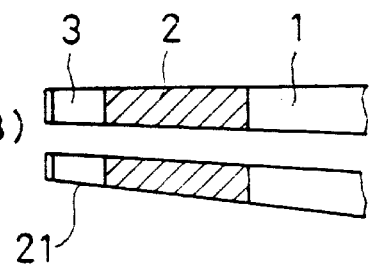
Figure 3C:
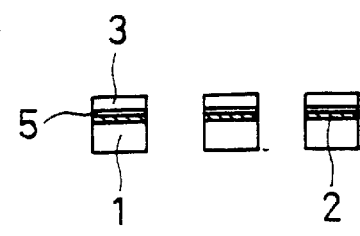
Figure 3D:
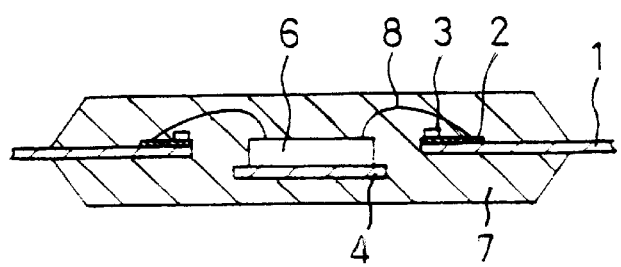
Figure 3E:
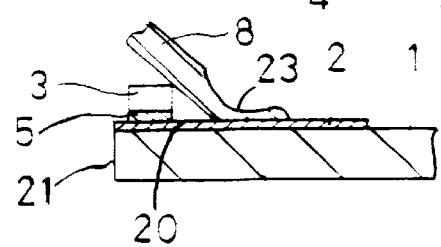

By forming the lead frame in the above-noted manner, as shown in FIG. 3 (D) and FIG. 3(E), it is possible to prevent the occurrence of a break in the bonding wire 8 by preventing the generation of the peeling of the lead 1 over a surface of the tip end portion 21 of the lead 1, caused by moisture content expansion when mounting is done by the user, from reaching the bonding portion, i.e., bonding ball, in the same manner as is done in the first embodiment of the present invention.

An mentioned above, in the present invention, even when peeling occurs at a tip end portion 21 of the lead, the peeling can be stopped by the peel generation preventing means 3 so that the progress of the peeling is prevented from extending over the peel generation preventing means 3 to the bonding portion 23.

Further in the present invention, the peel generation preventing means 3 is preferably fixed to the surface of the lead portion 1 with an adhesive material 5, and more over, the surface of the lead portion 1 to which the peel generation preventing means 3 is provided, may be covered with a plating layer.

On the other hand, in the present invention, the surface of the lead portion 1 to which the peel generation preventing means 3 is provided, may not be covered with a plating layer and in this case, the peel generation preventing means 3 is preferably made of an insulating material.

In one embodiment of the present invention, the peel generation preventing means 3 is formed in a cape-like configuration and is arranged so as to bridge over a plurality of leads 1 leading these plurality of leads to be in a fixed condition so as to make the bonding operation easy.

Figure 4A:
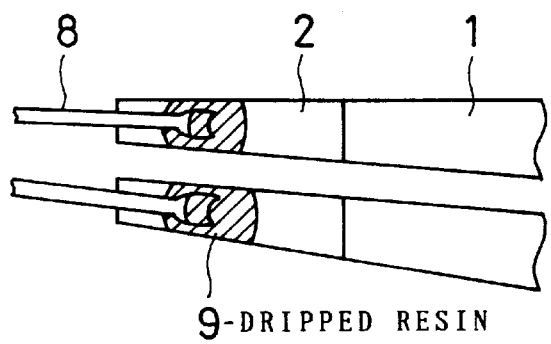
FIGS. 4(A) through 4(C) are a partial enlarged plan view of a lead of a lead frame according to the third embodiment of the present invention, the cross-sectional view thereof, and the cross-sectional view of a resin-sealed semiconductor device which uses this lead frame.
Figure 4B:
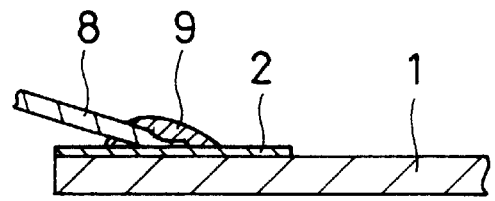
Figure 4C:
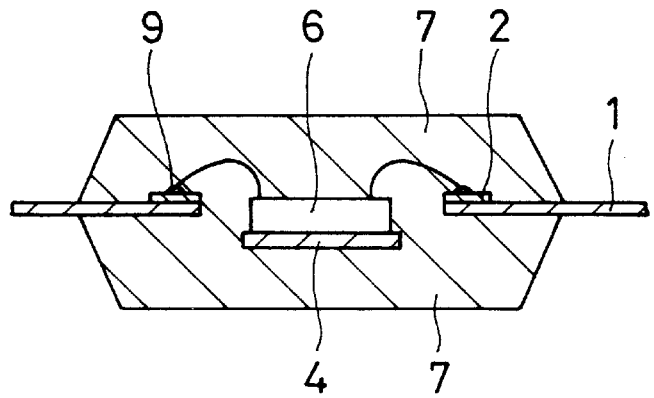

FIG. 4(A) through FIG. 4(C) are a partial enlarged plan view of a lead of a lead frame of according to the third embodiment of the present invention, the cross sectional view thereof, and the cross-sectional view of a resin-sealed semiconductor device which uses this lead frame.

In a lead frame according to the present invention and a resin-sealed semiconductor device which uses the above-noted lead frame, as shown in FIG. 4 (A) through FIG. FIG. 4(C), after connecting the handing wire 8 to the lead frame 1 as in the prior art, protection is provided to the bonding portion, i.e., bonding ball, by means of dripped resin 9.

This dripped resin 9 is applied by dripping fluid polyimide resin or acrylic resin, and in the case of polyimide resin, by additionally performing curing of the resin using UV light, thereby forming a protective layer. It is sufficient that the amount of dripped resin 9 be enough to cover the bonding ball. After that is done, the package is sealed using resin 7.

Figure 5:
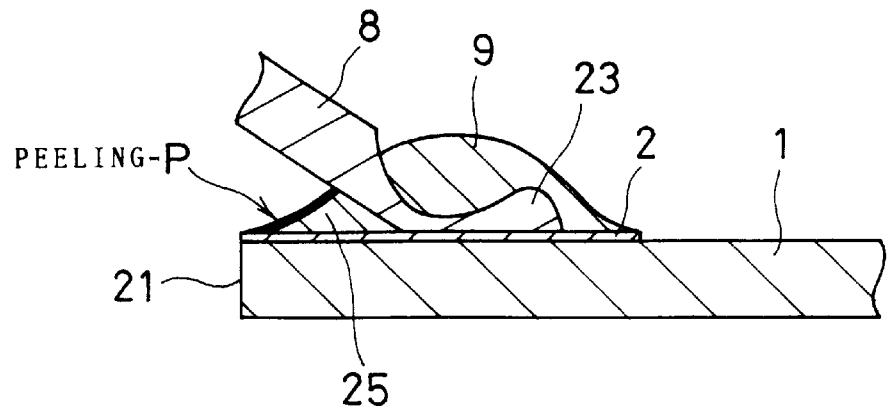
FIG. 5 is a cross-sectional view which illustrates the effect of the third embodiment of the present invention.
Figure 6A:
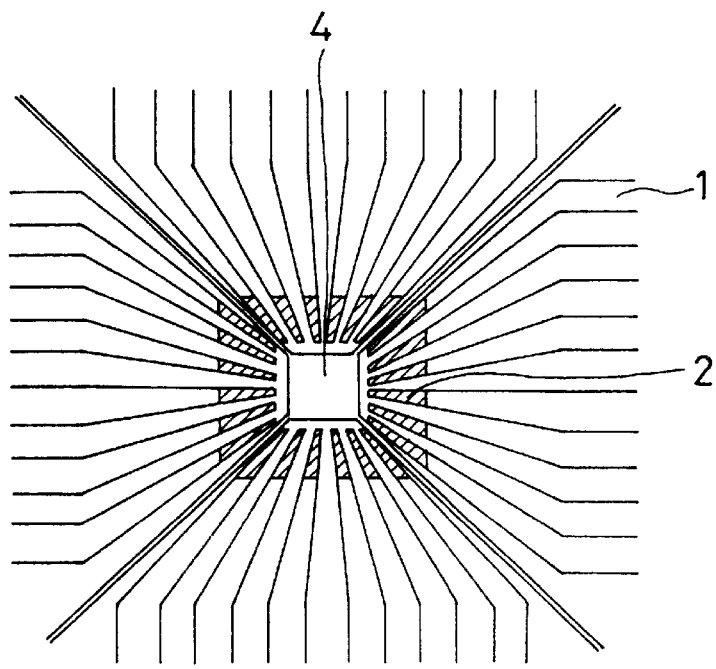
FIG. 6(A) is a plan view of an example of a prior art lead frame.
Figure 6B:
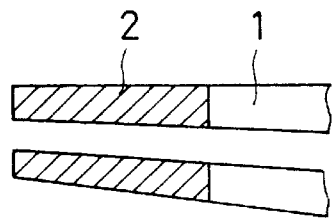
FIG. 6(B) is a partial enlarged plan view of the lead part thereof.
Figure 6C:
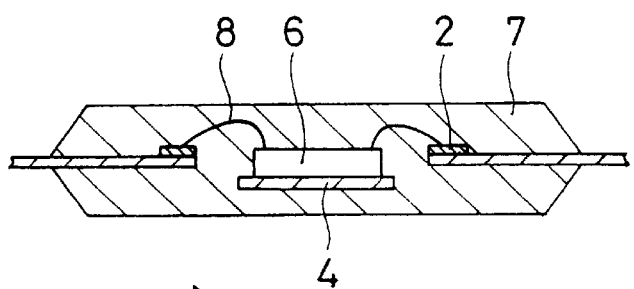
FIG. 6(C) is a cross-sectional view of a resin-sealed semiconductor device that uses the above-noted lead frame.
Figure 6D:
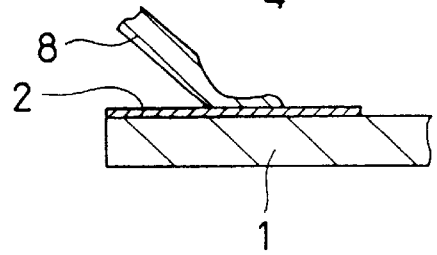
FIG. 6(D) is a partial enlarged cross-sectional view of the connection part between the bonding wire and the lead.
Figure 7A:
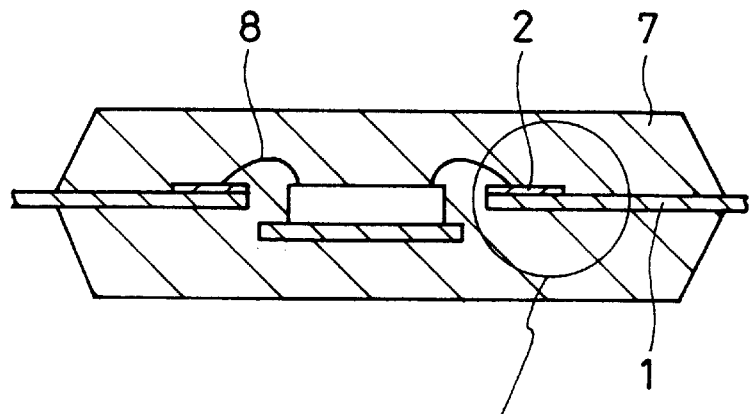
FIG. 7(A) through FIG. 7(C) arc cross-sectional view of a resin-sealed semiconductor device which illustrate the problem with a prior art lead frame, and a cross-sectional view which illustrates the occurrence of peeling at part A thereof.
Figure 7B:
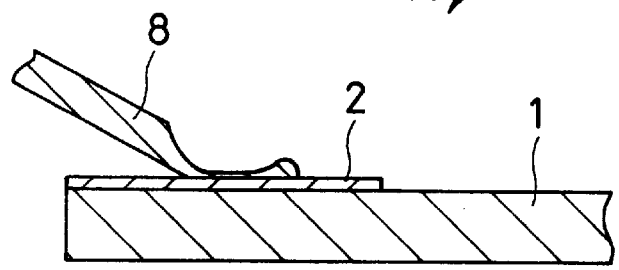
Figure 7C:
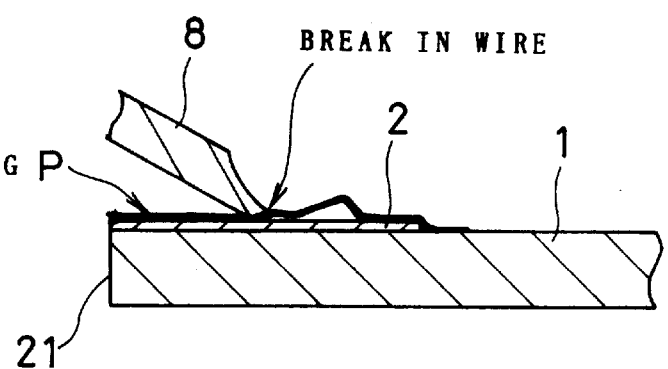

By configuring a semiconductor device in the above-noted manner, as shown in FIG. 5, even, if peeling P occurs, this peeling P is prevented from reaching the bonding wire 8 because of the dripped resin 9 protection at the thin, crushed part of the bonding ball.

As apparent from the above mentioned explanation of the third embodiment of the present invention, the peel generation preventing means 3 is formed by dripping resin material 9 over a portion of the lead 1 and to which a bonding wire 8 was connected after wire-bonding operation had been completed, so that a part of the resin material 25 exists between the tip portion 21 of the lead 1 and a bonding portion 23 of the lead 1 to which the bonding wire 8 is connected.

The table 1 below shows comparative experimental data of the lead frames made by a conventional method as mentioned in this specification and by a method of the present invention.

In this comparative experiments, four kinds of lead frames each having the same lead pattern to each other and the same type of chips had been mounted on each one of the samples.

While, for the sample of the present invention, the first embodiment as shown in FIG. 1(A) to FIG. 1(E) was applied thereto.

These four bonded lead frames A to D had been evaluated under the condition of holding same in an atmosphere of 30° C., 70% RH for 168 hours absorption and applying thereto mounting stress of 240° C. at peak value.

TABLE 1

|  | rots | occurrence rate of opened wiring after mounting stress had been applied to each samples |
|---|---|---|
| Prior art | A | 17/20 = 85% |
|  | B | 11/20 = 55% |
|  | C | 20/20 = 100% |
| Present invention | D | 0/20 = 0% |

As apparent from this comparative data, the present invention can provide sophisticated character over the wire bonding portion in lead frame comparing with those of the conventional method.

The present invention can also provide a semiconductor device in which the above-mentioned lead frame is used therein and thus the semiconductor device of the present invention is such that the device comprises a semiconductor chip, and a lead frame comprising a plurality of leads and wherein each one of leads being provided with a peel generation preventing means on a surface of a portion of a lead which is formed between a tip portion of the lead and a portion thereof to which a bonding wire is connected, and wherein the semiconductor chip being mounted onto the lead frame and sealed with resin.

On the other hand, in the present invention can also provide a method for making the lead frame and a method for making the wire holdings portion as follows;

A method for making a lead frame of the present invention which comprises a plurality of leads wherein the method comprises the steps of; preparing lead frame; forming a plating layer on a surface of a portion close to a tip end portion of the lead to define a wire bonding area; and providing a peel generation preventing means on a surface of a portion of the lead and formed between the tip end portion of the lead and the wire bonding area.

And further a method for making a wire bonding on a lead frame comprising a plurality of leads wherein the method comprises the steps of; preparing lead frame; forming a plating layer on a surface of a portion close to a tip end portion of the lead to define a wire bonding area; forming a wire bonding by connecting an end of a wire to be bonded to the wire bonding area; and dripping resin material over the bonded portion to cover the bonded portion therewith so that a part of the resin material exists between the tip end portion of the lead and a portion thereof to which the bonding wire is connected.

The first effect of the present invention is that peeling of the lead tip surface which occurs because of water content expansion happening by user mounting of a device is prevented from reaching the bonding wire, thereby preventing a break in the bonding wire.

The reason for this is that the peeling P from the lead tip surface 20 which occurs because of thermal stress applied to mounting, is stopped by the insulating tape before the bonding ball.

The second effect of the present invention is that it is possible to minimize open circuit failures of bonding wires caused by peeling due to water content expansion caused by user mounting of tile device, by applying protection to the bonding ball. The reason for this is that, by protecting the bonding ball at the location at which the bonding wire is crushed and made thin, although peeling of the lead tip normally occurs at the bonding wire part, it tends not to case a short in the bonding wire.

What is claimed is:

1. A lead frame comprising, a plurality of leads, each one of said plurality of leads being provided with a peel generation preventing means on a surface of said lead between a tip portion of said lead and a portion thereof to which a bonding wire is connected, said peel generation preventing means having a width narrower than a length formed between said tip portion of said lead and said portion to which said wire is bonded, said peel generation preventing means comprising an insulating material layer disposed on the surface of said lead and being encapsulated in a resin encapsulating the lead frame, the peel generation preventing means preventing peeling that can occur between the resin and the lead if the peel generation preventing means is not present.

2. A lead frame according to claim 1, wherein said peel generation preventing means projects from said surface of said lead and is spaced from said bonding wire.

3. A lead frame according to claim 2, wherein said peel generation preventing means is of a resin material.

4. A lead frame according to claim 2, wherein said peel generation preventing means is fixed to said surface of said lead with an adhesive material.

5. A lead frame according to claim 4, wherein said surface of said lead to which said peel generation preventing means is provided is covered with a plating layer.

6. A lead frame according to claim 4, wherein said surface of said lead to which said peel generation preventing means is provided is not covered with a plating layer.

7. A lead frame according to claim 6, wherein said peel generation preventing means is made of an insulating material.

8. A lead frame according to claim 7, wherein said peel generation preventing means is of a tape-like configuration and is arranged so as to bridge along said plurality of leads so that said leads are thereby fixed to each other.

9. A lead frame comprising, a plurality of leads and each one of said plurality of leads being provided with a peel generation preventing means on a surface of said lead between a tip portion of said lead and a portion thereof to which a bonding wire is connected, said peel generation preventing means having a width narrower than a length formed between said tip portion of said lead and said portion to which said wire is bonded, said peel generation preventing means comprising a dripping resin material on a portion of said lead to which a bonding wire is connected and being disposed between said tip portion of said lead and said portion thereof to which said bonding wire is connected, said peel generation preventing means comprising an insulating material layer disposed on the surface of said lead and being encapsulated in a resin encapsulating the lead frame, the peel generation preventing means preventing peeling that can occur between the resin and the lead if the peel generation preventing means is not present.

10. A semiconductor device comprising:

a semiconductor chip; and a lead frame including a plurality of leads and each one of said plurality of leads being provided with a peel generation preventing means on a surface of said lead between a tip portion of said lead and a portion thereof to which a bonding wire is connected, said peel generation preventing means having a width narrower than a length formed between said tip portion of said lead and said portion to which said wire is bonded, said semiconductor chip being mounted onto said lead frame and sealed with resin, said peel generation preventing means comprising an insulating material layer disposed on the surface of said lead, and being encapsulated in the resin encapsulating the semiconductor chip, the peel generation preventing means preventing peeling that can occur between the resin and the lead if the peel generation preventing means is not present.

11. A lead frame which is used in a semiconductor device in which an electrical connection between a semiconductor chip and an external portion is made with a bonding wire, said lead frame comprising an island portion and a plurality of leads to which one end of said bonding wire is connected, and a region of each one of said plurality of leads to which said bonding wire is connected being provided with a plating layer, a separate region of said respective lead formed at a position on said lead opposite to said island portion seen from the position of said plating layer being provided with an insulating tape through an adhesive so that said insulating tape is independently attached to each one of said leads, respectively, and each one of said leads adjacently arranged to each other being separated from each other.

12. A lead frame which is used in a semiconductor device in which an electrical connection between a semiconductor chip and an external portion is made with a bonding wire, said lead frame comprising an island portion and a plurality of leads to which one end of said bonding wire is connected, and a region of each one of said plurality of leads to which said bonding wire is connected being provided with a plating layer, a separate region of said respective lead formed at a position on said lead opposite to said island portion seen from the position of said plating layer being provided with a dripped resin, the dripped resin encapsulating a portion of said bonding wire where the bonding wire connects to said plating layer, the dripped resin further being provided at a position between said bonding wire and said plating layer.

* * * * *